(12) United States Patent
Cheng et al.

(10) Patent No.: US 9,698,380 B2
(45) Date of Patent: Jul. 4, 2017

(54) ELECTROLUMINESCENCE DISPLAY DEVICE WITH A PROTECTIVE LAYER AND FABRICATION METHOD THEREOF

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 4 days.

(21) Appl. No.: 14/429,523

(22) PCT Filed: Aug. 1, 2014

(86) PCT No.: PCT/CN2014/083564
§ 371 (c)(1),
(2) Date: Mar. 19, 2015

(87) PCT Pub. No.: WO2015/039501
PCT Pub. Date: Mar. 26, 2015

(65) Prior Publication Data
US 2016/0036004 A1    Feb. 4, 2016

(30) Foreign Application Priority Data

Sep. 23, 2013  (CN) .......................... 2013 1 0436149

(51) Int. Cl.
*H01L 51/56* (2006.01)
*H01L 51/52* (2006.01)
*H01L 27/32* (2006.01)

(52) U.S. Cl.
CPC ........ *H01L 51/5259* (2013.01); *H01L 27/322* (2013.01); *H01L 27/3251* (2013.01);
(Continued)

(58) Field of Classification Search
CPC . H01L 51/5259; H01L 51/56; H01L 51/5284; H01L 27/3251; H01L 27/322; H01L 51/5253; H01L 51/52; H01L 27/32
(Continued)

(56) References Cited

U.S. PATENT DOCUMENTS 6,538,374 B2   3/2003  Hosokawa
7,309,957 B2  12/2007  Park et al.
(Continued)

FOREIGN PATENT DOCUMENTS

CN   1363200 A   8/2002
CN   1481205 A   3/2004
(Continued)

OTHER PUBLICATIONS

Mar. 29, 2016—International Preliminary Report on Patentability Appl PCT/CN2014/083564.
(Continued)

*Primary Examiner* — Selim Ahmed
(74) *Attorney, Agent, or Firm* — Banner & Witcoff, Ltd.

(57) ABSTRACT

Embodiments of the disclosure disclose an electroluminescence display device and a fabrication method thereof. The device comprises a color filter substrate. The color filter substrate comprises: a first substrate, and a first electrode, an organic electroluminescence layer and a second electrode sequentially provided on the first substrate. The color filter substrate further comprises: a first protective layer, provided on the second electrode and covering the second electrode and the organic electroluminescence layer below the second electrode; and a first connection electrode, provided on the first protective layer and connected to the second electrode.

15 Claims, 4 Drawing Sheets

(52) U.S. Cl.
CPC ...... *H01L 51/5253* (2013.01); *H01L 51/5284* (2013.01); *H01L 51/56* (2013.01)

(58) Field of Classification Search
USPC .............................................. 257/40; 438/29
See application file for complete search history.

(56) References Cited

U.S. PATENT DOCUMENTS

| | | | |
|---|---|---|---|
| 7,510,905 B2* | 3/2009 | Fujii | H01L 27/12 438/149 |
| 2001/0026127 A1 | 10/2001 | Yoneda et al. | |
| 2002/0011783 A1 | 1/2002 | Hosokawa | |
| 2003/0146696 A1 | 8/2003 | Park et al. | |
| 2004/0036410 A1 | 2/2004 | Park et al. | |
| 2004/0140762 A1* | 7/2004 | Tohma | H01L 27/322 313/506 |
| 2007/0132374 A1 | 6/2007 | Park | |

FOREIGN PATENT DOCUMENTS

| | | |
|---|---|---|
| CN | 1535090 A | 10/2004 |
| CN | 102566145 A | 7/2012 |
| CN | 103474581 A | 12/2013 |
| CN | 203456514 U | 2/2014 |
| JP | 2004327215 A | 11/2004 |

OTHER PUBLICATIONS

May 6, 2015—(CN)—First Office Action for Appn 201310436149.X with Eng Tran.
Sep. 29, 2015—(CN)—Second Office Action Appn 201310436149.X with English Tran.
Oct. 27, 2014—(WO) International Search Report—App PCT/CN2014/083564.

* cited by examiner

ELECTROLUMINESCENCE DISPLAY DEVICE WITH A PROTECTIVE LAYER AND FABRICATION METHOD THEREOF

The application is a U.S. National Phase Entry of International Application No. PCT/CN2014/083564 filed on Aug. 1, 2014, designating the United States of America and claiming priority to Chinese Patent Application No. 201310436149.X filed on Sep. 23, 2013. The present application claims priority to and the benefit of the above-identified applications and the above-identified applications are incorporated by reference herein in their entirety.

TECHNICAL FIELD

Embodiments of the disclosure relate to an electroluminescence display device and a fabrication method thereof.

BACKGROUND

Recently, Organic Light Emitting Diode (OLED) display device, also referred to as electroluminescence display device, has been widely applied to a mobile communication terminal, a personal digital assistant (PDA), a pocket PC, etc., due to its outstanding features such as self-luminescence, no need of backlight, high contrast, small thickness, wide viewing angle, quick response, suitable for wide temperature range, simple structure, simple fabrication process, and so on. The OLED display devices are divided into a passive matrix type and an active matrix type. In the OLED display device of active matrix type, each OLED is controlled by a Thin Film Transistor (TFT) circuit, and high luminescence efficiency and good image display effect can be achieved.

A conventional OLED display device of active matrix type is shown in FIG. 1, and comprises a color filter substrate 10 and an array substrate 20. A fabrication process of the color filter substrate comprises: sequentially forming a color filter layer, a flattening layer 13, a first electrode 14, an organic electroluminescence (EL) layer 15 and a second electrode 16 on a first substrate 11. The color filter layer comprises a black matrix 121 and color filters 122 separated by the black matrix 121. A fabrication process of the array substrate comprises: forming a thin film transistor 22 on a second substrate 21, covering a protective layer 23 on the thin film transistor 22, and then forming a connection electrode 24 on the protective layer 23. The connection electrode 24 is electrically connected with a drain electrode the thin film transistor 22 through a via hole provided in the protective layer 23. Finally, a sealant 30 is coated on an edge of the color filter substrate 10 and/or array substrate 20, the color filter substrate 10 and the array substrate 20 are bonded with each other, and the second electrode 16 on the color filter substrate is in contact with the corresponding connection electrode 24 on the array substrate 20 so as to be electrically connected with each other.

In the above OLED display device shown in FIG. 1, the organic electroluminescence layer 15 is provided in a space enclosed by the color filter substrate 10, the array substrate 20 and the sealant 30; because the sealing effect of the sealant 30 is not enough, it is very easy for oxygen and moisture in the air to damage the organic electroluminescence layer 15, thus the service life and reliability of the OLED display device are degraded.

SUMMARY

According to embodiments of the disclosure, an electroluminescence display device is provided. The device comprises a color filter substrate. The color filter substrate comprises: a first substrate, and a first electrode, an organic electroluminescence layer and a second electrode sequentially provided on the first substrate. The color filter substrate further comprises: a first protective layer, provided on the second electrode and covering the second electrode and the organic electroluminescence layer below the second electrode; and a first connection electrode, provided on the first protective layer and connected to the second electrode.

For example, at a position where the first connection electrode is provided, the first protective layer protrudes along a direction away from the second electrode to form a protrusion; the first protective layer is provided with a first protective layer via-hole at the protrusion; and the first connection electrode is connected to the second electrode through the first protective layer via-hole.

For example, the color filter substrate further comprises: a color filter layer provided between the first substrate and the first electrode; the color filter layer comprises a black matrix and color filters separated by the black matrix; the second electrode is provided to correspond to the color filter, and the first connection electrode is provided to correspond to the black matrix; in a region corresponding to the first connection electrode, the first protective layer protrudes along a direction away from the second electrode to from a protrusion; the first protective layer is provided with a window at a position where the second electrode is provided, and a portion of or the entire of the second electrode is exposed out of the window; the first connection electrode is provided on the protrusion, and the first connection electrode extends to the window to partially or completely covering an exposed portion of the second electrode.

For example, the protrusion has a height of 1.5-2.5 micron.

For example, the first connection electrode has a thickness of 0.3-1 micron.

For example, the first protective layer is made of silicon nitride, silicon oxide, photosensitive resin, or combinations thereof.

For example, the photosensitive resin is a polyacrylic resin, a polyimide resin, or a polyamide resin.

For example, the device further comprises an array substrate. The array substrate comprises: a second substrate, a thin film transistor provided on the second substrate, a protective layer covering the thin film transistor, and a second connection electrode provided on the protective layer; and the protective layer is provided with a protective layer via-hole, and the second connection electrode is connected to a drain electrode of the thin film transistor through the protective layer via-hole.

For example, the second connection electrode is in contact with and is electrically connected with the first connection electrode.

For example, at a position where the second connection electrode is provided, the protective layer protrudes along a direction away from the thin film transistor to form a protrusion.

According to embodiments of the disclosure, a fabrication method of an electroluminescence display device is provided. The method comprises a fabrication process of a color filter substrate. The fabrication process of the color filter substrate comprises: forming a first electrode, an organic electroluminescence layer and a second electrode on a first substrate; forming a first protective layer on the first substrate on which the first electrode, the organic electroluminescence layer and the second electrode have been formed, the first protective layer covering the second electrode and the organic electroluminescence layer below the second electrode; and forming a first connection electrode on the first substrate on which the first electrode, the organic electroluminescence layer, the second electrode and the first protective layer have been formed, the first connection electrode being connected with the second electrode.

For example, the forming the first protective layer comprises: forming the first protective layer; and forming a protrusion at a position of the first protective layer where the first connection electrode is to be formed and meanwhile forming a first protective layer via-hole at the protrusion by a patterning process.

For example, before the forming the first electrode, the organic electroluminescence layer and the second electrode on the first substrate, the method further comprises: forming a color filter layer, the color filter layer comprises a black matrix and color filters separated by the black matrix; the forming the first protective layer comprises: forming the first protective layer; and forming a protrusion at a position of the first protective layer where the first connection electrode is to be formed by a patterning process, and meanwhile forming a window at a position where the second electrode is located so that a portion of or the entire of the second electrode is exposed out of the window, the second electrode being provided to correspond to the color filter, and the first connection electrode being provided to correspond to the back matrix; the forming the first connection electrode comprises: forming an electrode layer, and forming the first connection electrode on the protrusion and on an exposed portion of the second electrode by a patterning process, the first connection electrode partially or completely covering the exposed portion of the second electrode.

For example, the fabrication method further comprises a fabrication process of an array substrate. The fabrication process of the array substrate comprises: forming a thin film transistor on a second substrate; forming a protective layer on the thin film transistor, and forming a protective layer via-hole above a drain electrode of the thin film transistor by a patterning process; forming a second connection electrode on the protective layer, the second connection electrode being connected with the drain electrode of the thin film transistor through the protective layer via-hole.

For example, the fabrication process of the array substrate further comprises: at a position where the second connection electrode is provided, the protective layer protrudes along a direction away from the thin film transistor to form a protrusion.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

In the specification and claims of the disclosure, words such as "first", "second" or the like do not denote any sequence, quantity or significance, but are only used for distinguishing different components.

Figure 1:
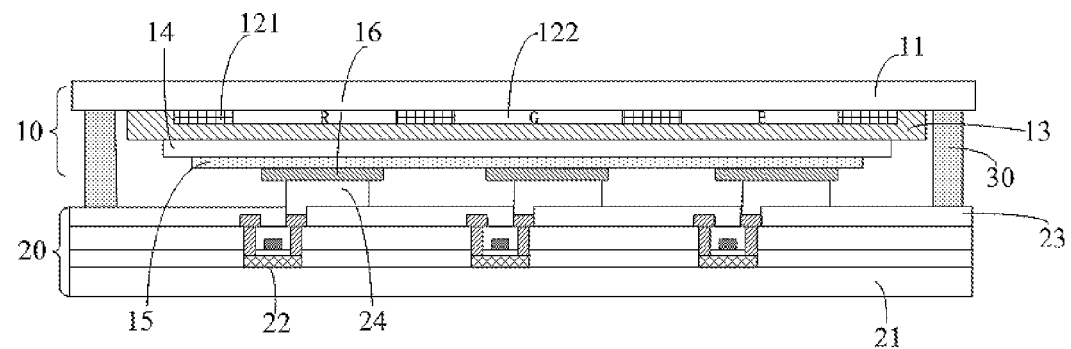
FIG. 1 is a structural schematic view illustrating a conventional OLED display device of active matrix type.
Figure 2:
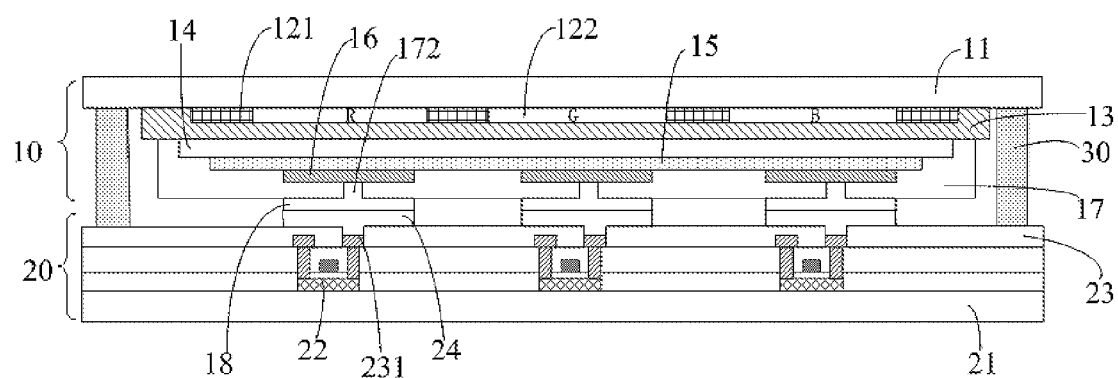
FIG. 2 is a structural schematic diagram I illustrating an electroluminescence display device according to embodiments of the disclosure.

Embodiments of the disclosure provide an electroluminescence display device. As shown in FIG. 2, the device comprises: a color filter substrate 10 and an array substrate 20. The color filter substrate 10 comprises: a first substrate 11, and a color filter layer, a flattening layer 13, a first electrode 14, an organic electroluminescence layer 15 and a second electrode 16 sequentially provided on the first substrate 11. The color filter substrate 10 further comprises: a first protective layer 17, provided on the second electrode 16 and covering the second electrode 16 and the organic electroluminescence layer 15 below the second electrode 16; and a first connection electrode 18, provided on the first protective layer 17. The first connection electrode 18 is connected with the second electrode 16.

In the embodiments of the disclosure, the first protective layer 17 entirely covers the color film substrate where the first electrode 14, the organic electroluminescence layer 15 and the second electrode have been formed, that is, the first protective layer 17 entirely covers the second electrode 16 and the organic electroluminescence layer 15 below the second electrode 16, in order to ensure that the organic electroluminescence layer 15 has no portions exposed outside. The first connection electrode 18 is provided on the first protective layer 17, and the first connection electrode 18 is connected with the second electrode 16 through a first protective layer via-hole 172 in the first protective layer 17.

In the embodiments of the disclosure, the first protective layer 17 entirely covers the second electrode 16 and the organic electroluminescence layer 15 below the second electrode 16, which prevents the organic electroluminescence layer 15 from being damaged by water and oxygen. Thus, the reliability of the OLED display device is improved, and the service life of the OLED display device is prolonged.

Figure 3:
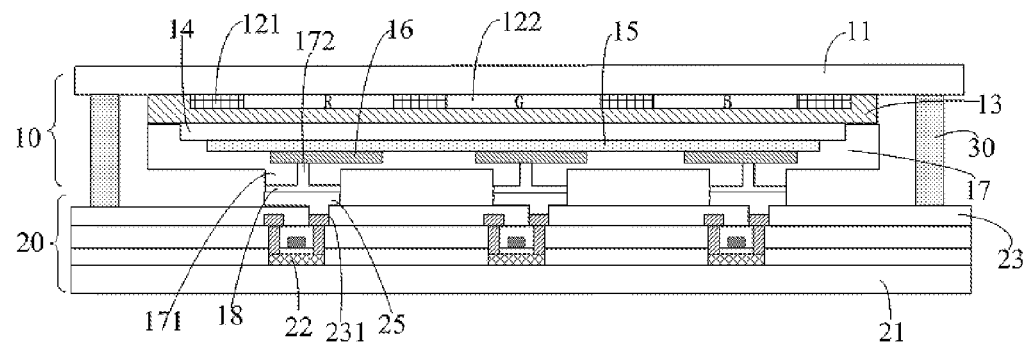
FIG. 3 is a structural schematic diagram II illustrating the electroluminescence display device according to the embodiments of the disclosure.

As shown in FIG. 3, at a position where the first connection electrode 18 is provided, the first protective layer 17 protrudes along a direction away from the second electrode 16 to form a protrusion 171; the first protective layer via-hole 172 is located at the protrusion 171, and the first connection electrode 18 is connected to the second electrode 16 through the first protective layer via-hole 172.

The first protective layer 17 is formed to have protrusions, each protrusion 171 is provided with the first protective layer via-hole 172, the first connection electrode 18 is provided on each protrusion 171, and the first connection electrode 18 is connected with the second electrode 16 through the first protective layer via-hole 172. Positions of the protrusion 171 and the first connection electrode 18 correspond to a thin film transistor serving as a driving element on the array substrate.

In addition, as shown in FIG. 2 and FIG. 3, the electroluminescence display device in the embodiments of the disclosure further comprises an array substrate 20; the array substrate 20 comprises: a second substrate 21, the thin film transistor 22, a protective layer 23 covering the thin film transistor 22 and a second connection electrode 25 provided on the protective layer 23, and the thin film transistor 22, the protective layer 23 and the second connection electrode 25 are sequentially provided on the second substrate 21. The protective layer 23 is provided with a protective layer via-hole 231, through which the second connection electrode 25 is connected to a drain electrode of the thin film transistor 22. A sealant 30 is coated on an edge of the color filter substrate 10 and/or array substrate 20, the color filter substrate 10 and the array substrate 20 are bonded with each other to form the electroluminescence display device. After the color filter substrate 10 and the array substrate 20 are bonded with each other, the second connection electrode 25 is in contact with and is electrically connected with the first connection electrode 18, such that the thin film transistor 22 is connected with the second electrode 16.

It should be noted that a TFT circuit (a driving circuit) is provided on the array substrate 20 so as to drive and compensate the OLED. In the embodiments of the present disclosure, by the connection of the first and second connection electrodes after the color filter substrate 10 and the array substrate 20 are bonded with each other, the electrical connection between the driving circuit and the light emitting device is accomplished. The TFT circuit at least comprises the thin film transistor 22 serving as the driving element. It should be noted that, a specific structure of the TFT circuit has no direct relationship with the embodiments of the present disclosure, nor does it affect effects of the embodiments of the disclosure; therefore, the embodiments of the disclosure do not limit the structures of the TFT circuit, which may be any one well known by those skilled in the art.

The protrusion shown in FIG. 3 raises the first connection electrode 18, and the array substrate and the color filter substrate bonded with each other have a bearing point at a contact surface between the first connection electrode 18 and the second connection electrode 25 so that the reliability of the electrical connection between the first connection electrode 18 and the second connection electrode 25 is improved. On the other hand, the first connection electrode 18 is raised by the protrusion, and meanwhile the first protective layer 17 covers the organic electroluminescence layer 15, so as to avoid damage to the organic electroluminescence layer 15 caused by squeezing or friction between the color filter substrate and the array substrate during the bonding process and after the bonding process.

Figure 4:
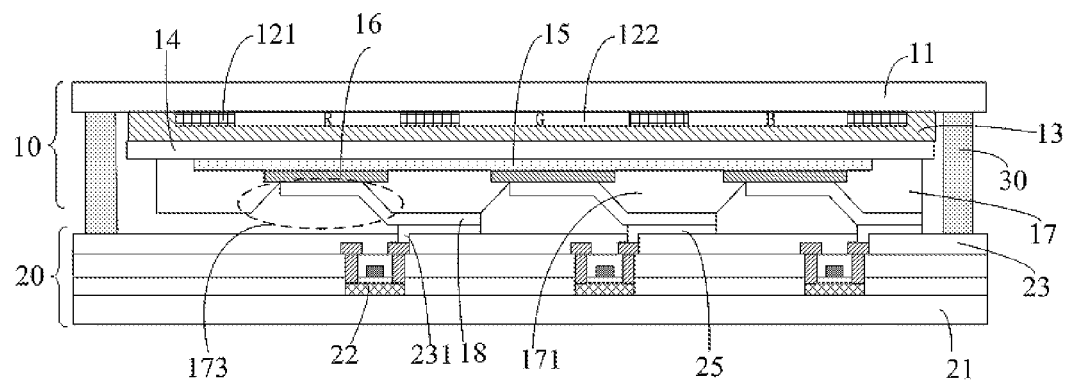
FIG. 4 is a structural schematic diagram III illustrating the electroluminescence display device according to the embodiments of the disclosure.

As shown in FIG. 4, the color filter layer comprises a black matrix 121 and color filters 122 separated by the black matrix 121. The second electrode 16 is provided to correspond to the color filter 122, and the first connection electrode 18 is provided to correspond to the back matrix 121. In a region corresponding to the first connection electrode 18, the first protective layer 17 protrudes along a direction away from the second electrode 16 to from the protrusion 171. The first protective layer 17 is provided with a window 173 at a position where the second electrode 16 is located, and a portion of or the entire of the second electrode 16 is exposed out of the window 173. The first connection electrode 18 is provided on the protrusion 171, and the first connection electrode 18 extends to the window 173 to partially or completely cover an exposed portion of the second electrode 16.

For example, in the embodiments of the present disclosure, the color filters 122 comprise, but not limited to, a red color filter, a green color filter and a blue color filter (R/G/B). In the embodiments of the present disclosure, the window 173 is provided to correspond to the color filter 122 in the color filter layer, and the protrusion 171 is provided to correspond to the black matrix 121; and the second connection electrode 25 is in contact with and is electrically connected with the first connection electrode 18 on the protrusion 171 at the time of bonding the color filter substrate with the array substrate. After the color filter substrate and the array substrate are bonded with each other, the bearing point is on the protrusion 171, so the protrusion in the embodiments of the disclosure reduces the force exerted on the organic electroluminescence layer 15 in a region (a pixel region) corresponding to the color filter 122 to better protect the organic electroluminescence layer 15.

Figure 5:
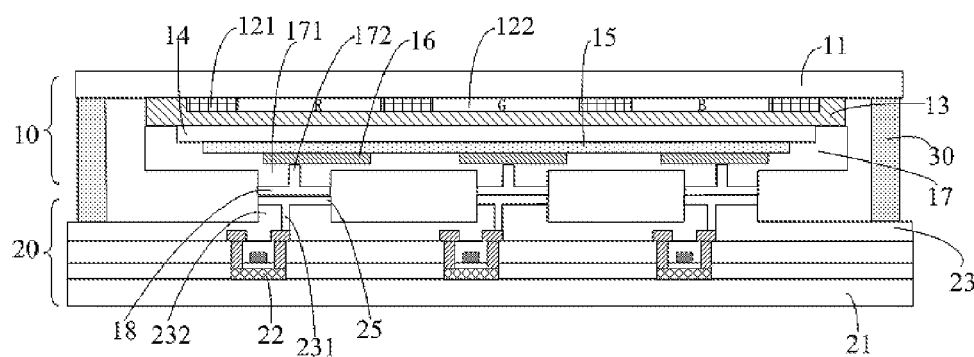
FIG. 5 is a structural schematic diagram IV illustrating the electroluminescence display device according to the embodiments of the disclosure.

As shown in FIG. 5, in a region corresponding to the second connection electrode 25 on the array substrate 20, the protective layer 23 protrudes along a direction away from the thin film transistor 22 to form a second protrusion 232; and the protective layer via-hole 231 is provided at the second protrusion 232. The second connection electrode 25 is raised by the second protrusion 232, which can avoid damage to the thin film transistor caused by squeezing or friction between the color filter substrate 10 and the array substrate 20 during or after bonding the color filter substrate and the array substrate. Thus, the yield is improved.

For example, the first protective layer 17 is made of silicon nitride, silicon oxide, photosensitive resin, or combinations thereof. For example, the photosensitive resin is: a polyacrylic resin, a polyimide resin, or a polyamide resin. For example, a silicon nitride film is firstly formed, and then a silicon oxide film is formed on the silicon nitride film, so that the silicon nitride film and the silicon oxide film constitute the first protective layer 17.

For example, the protrusion 171 has a height of 1.5-2.5 micron. For example, the first connection electrode 18 has a thickness of 0.3-1 micron. Due to the existences of the protrusions, the first connection electrode 18 and the second connection electrode 25 is fabricated to be thinner, so that a deposition time and an etching time of the first connection electrode 18 and the second connection electrode 25 are shortened, thereby simplifying the fabrication process and improving the production efficiency.

In the electroluminescence display device in the embodiments of the disclosure, on the one hand, the organic electroluminescence layer is prevented from being damaged by water and oxygen, thus reliability of the OLED display device is improved and the service life of the OLED display device is prolonged; and on the other hand, defects caused by squeezing or friction between the color filter substrate and the array substrate is avoided, so that the yield is improved.

The embodiments of the disclosure further provide a fabrication method of an electroluminescence display device, and the method comprises: a fabrication process of a color filter substrate, a fabrication process of an array substrate, and a process of bonding the color filter substrate and the array substrate. For example, the fabrication process of the color filter substrate comprises the following steps.

101: forming a first electrode 14, an organic electroluminescence layer 15 and a second electrode 16 on a first substrate 11.

Figure 6A:
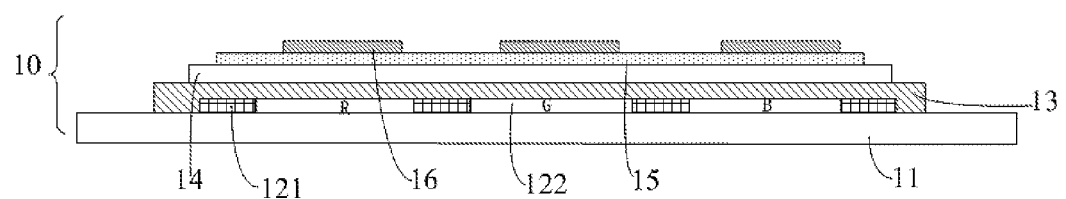
FIG. 6(a) is a structural schematic view illustrating a color filter substrate before a protective layer is formed according to the embodiments of the disclosure.

As shown in FIG. 6(a), a color filter layer, a flattening layer 13, the first electrode 14, the organic electroluminescence layer 15 and the second electrode 16 are sequentially formed on a base substrate (i.e., the first substrate 11) of the color filter substrate. The color filter layer, the flattening layer 13, the first electrode 14, the organic electroluminescence layer 15 and the second electrode 16 may be made of any known materials with any known methods, which will not be repeated here.

Figure 6B:
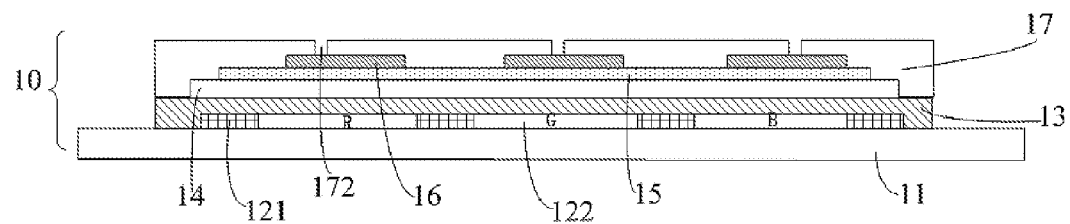
FIG. 6(b) is a structural schematic diagram I illustrating the color filter substrate after the protective layer is formed according to the embodiments of the disclosure.

102: forming a first protective layer 17 on the first substrate on which the first electrode 14, the organic electroluminescence layer 15 and the second electrode 16 have been formed, the first protective layer 17 covering the second electrode 16 and the organic electroluminescence layer 15 below the second electrode 16, as shown in FIG. 6(b).

For example, the first protective layer 17 is made of silicon nitride, silicon oxide, photosensitive resin, or combinations thereof. For example, the first protective layer 17 is made of the photosensitive resin; and in this case, the deposition process is simple, and only exposure and development are required to form a first protective layer via-hole 172 without etching.

103: forming a first connection electrode 18 on the first substrate on which the first electrode 14, the organic electroluminescence layer 15, the second electrode 16 and the first protective layer 17 have been formed, the first connection electrode 18 being connected with the second electrode 16 (for example, through the first protective layer via-hole 172), as shown in FIG. 2 and FIG. 3.

In the fabrication method of the electroluminescence display device according to the embodiments of the disclosure, the first protective layer 17 entirely covers the second electrode 16 and the organic electroluminescence layer 15 below the second electrode 16, so that the organic electroluminescence layer 15 has no portion exposed outside. Thus, the organic electroluminescence layer 15 is prevented from being damaged by water and oxygen, the reliability of the OLED display device is improved and the service life of the OLED display device is prolonged.

Figure 6C:
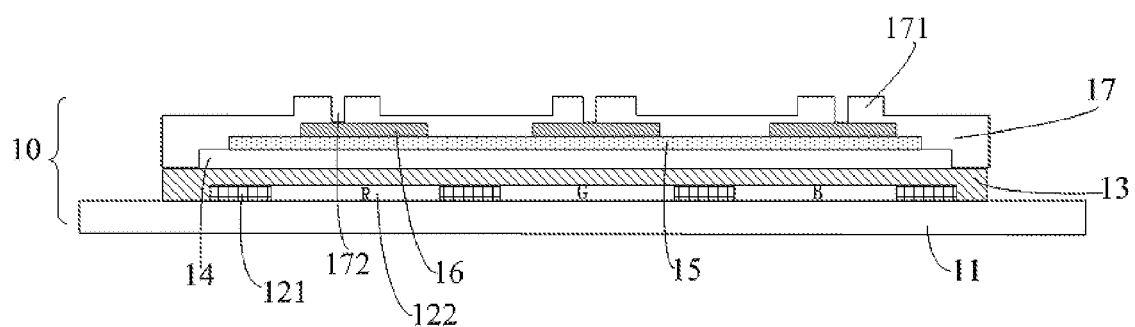
FIG. 6(c) is a structural schematic diagram II illustrating the color filter substrate after the protective layer is formed according to the embodiments of the disclosure.

For example, the first protective layer 17 is provided to have protrusions, as shown in FIG. 6(c). In this case, the step 102 of forming the first protective layer 17 comprises:

Step 1: forming the first protective layer 17;

Step 2: forming a protrusion 171 at a position of the first protective layer 17 where the first connection electrode 18 is to be formed and meanwhile forming the first protective layer via-hole 172 at the protrusion 171 by a patterning process.

With reference to FIG. 4, before the forming the first electrode, the organic electroluminescence layer and the second electrode on the first substrate, the step 101 further comprises: forming the color filter layer, and the color filter layer comprises: a black matrix 121 and color filters 122 separated by the black matrix 121. In such case, the step 102 comprises: forming the first protective layer 17, and forming the protrusion 171 at the position of the first protective layer 17 where the first connection electrode 18 is to be formed by the patterning process, and meanwhile forming a window 173 at a position of the first protective layer 17 where the second electrode 16 is located so that a portion of or the entire of the second electrode 16 is exposed out of the window 173. The second electrode 16 is provided at a position corresponding to the color filter 122, and the first connection electrode 18 is provided at a position corresponding to the back matrix 121. The Step 103 comprises: forming an electrode layer, and forming the first connection electrode 18 on the protrusion 171 and on an exposed portion of the second electrode 16 by a patterning process. The first connection electrode 18 partially or completely covering the exposed portion of the second electrode 16.

By taking the case that the first protective layer is made of photoresist (one type of photosensitive resin) as an example, the fabrication method of the electroluminescence display device comprises the steps of:

Step 1: forming the first electrode 14, the organic electroluminescence layer 15, and the second electrode 16 on the color filter substrate, and coating the photosensitive resin (for example, the photoresist) on the second electrode 16, forming the protrusion 171 at the position where the first connection electrode is to be formed by exposing and developing processes, and meanwhile forming the window 173 at the position where the second electrode 16 is provided;

Step 2: forming the electrode layer, and then forming the first connection electrode 18 on the protrusion 171 and on the exposed portion of the second electrode 16 by using the patterning process comprising coating photoresist, exposing, developing, etching, and removing photoresist. The first connection electrode 18 partially or completely covers the protrusion 171 and the portion of the second electrode 16 exposed out of the window 173, so that the first connection electrode 18 is electrically connected with the second electrode 16. For example, the electrode layer is a metal layer, including, but not limited to, copper, molybdenum, tin, aluminum, silver, etc.

In the embodiments of the disclosure, the first protective layer 17 is provided to have the protrusion, so that defects caused by squeezing or friction between the color filter substrate and the array substrate is avoided and thus the yield is improved.

With reference to FIG. 2, the fabrication process of the array substrate in the embodiments of the disclosure comprises: Step 1: forming a thin film transistor 22; Step 2: forming a protective layer 23 on the thin film transistor 22, and forming a protective layer via-hole 231 above a drain electrode of the thin film transistor 22 by a patterning process; Step 3: forming a second connection electrode 25 on the protective layer, the second connection electrode 25 being connected to the drain electrode of the thin film transistor 22 through the protective layer via-hole 231.

Further, in the embodiments of the disclosure, the protective layer 23 for example is provided to have protrusion, so that the second connection electrode 25 is raised by a second protrusion 232. Thus, damages to the thin film transistor caused by squeezing or friction between the color filter substrate 10 and the array substrate 20 during or after the bonding process are avoided, and the yield is improved. With reference to FIG. 5, the forming the protective layer 23 on the thin film transistor 22 for example comprises: forming the protective layer 23; forming the second protrusion 232 at a position of the protective layer 23 where the second connection electrode 25 is to be formed by a patterning process, and meanwhile forming the protective layer via-hole 231.

After the fabrication process of the color filter substrate and the fabrication process of the array substrate are completed, the color filter substrate having the protrusion and the array substrate are bonded with each other, so that the second connection electrode 25 on the array substrate is in contact with the first connection electrode 18 located on the protrusion 171 of the color filter substrate to implement the electrical connection between the drive circuit and the light emitting device.

In the fabrication method of the electroluminescence display device according to the embodiments of the disclosure, on the one hand, the organic electroluminescence layer is prevented from being damaged by water and oxygen, thus the reliability of the OLED display device is improved and the service life of the OLED display device is prolonged; and on the other hand, defects caused by squeezing or friction between the color filter substrate and the array substrate is avoided, so that the yield is improved.

The foregoing embodiments merely are exemplary embodiments of the disclosure, and not intended to define the scope of the disclosure, and the scope of the disclosure is determined by the claims.

The present application claims priority of Chinese Patent Application No. 201310436149.X filed on Sep. 23, 2013, the disclosure of which is incorporated herein by reference in its entirety as part of the present application.

What is claimed is:

1. An electroluminescence display device, comprising: a color filter substrate; the color filter substrate comprising: a first substrate, and a first electrode, an organic electroluminescence layer and a second electrode sequentially provided on the first substrate;
    wherein the color filter substrate further comprises:
        a first protective layer, provided on the second electrode and covering the second electrode and the organic electroluminescence layer below the second electrode; and
        a first connection electrode, provided on the first protective layer and connected to the second electrode,
        wherein at a position where the first connection electrode is provided, the first protective layer protrudes along a direction away from the second electrode to form a protrusion; the first protective layer is provided with a first protective layer via-hole at the protrusion; and the first connection electrode is connected to the second electrode through the first protective layer via-hole.

2. The device according to claim 1, wherein the protrusion has a height of 1.5-2.5 micron.

3. The device according to claim 1, wherein the first connection electrode has a thickness of 0.3-1 micron.

4. The device according to claim 1, wherein the first protective layer is made of silicon nitride, silicon oxide, photosensitive resin, or combinations thereof.

5. The device according to claim 4, wherein the photosensitive resin is a polyacrylic resin, a polyimide resin, or a polyamide resin.

6. The device according to claim 1, further comprising: an array substrate, wherein
    the array substrate comprises: a second substrate, a thin film transistor provided on the second substrate, a protective layer covering the thin film transistor, and a second connection electrode provided on the protective layer; and
    the protective layer is provided with a protective layer via-hole, and the second connection electrode is connected to a drain electrode of the thin film transistor through the protective layer via-hole.

7. The device according to claim 6, wherein the second connection electrode is in contact with and is electrically connected with the first connection electrode.

8. The device according to claim 6, wherein at a position where the second connection electrode is provided, the protective layer protrudes along a direction away from the thin film transistor to form a protrusion.

9. An electroluminescence display device, comprising: a color filter substrate; the color filter substrate comprising: a first substrate, and a first electrode, an organic electroluminescence layer and a second electrode sequentially provided on the first substrate;
    wherein the color filter substrate further comprises:
        a first protective layer, provided on the second electrode and covering the second electrode and the organic electroluminescence layer below the second electrode; and
        a first connection electrode, provided on the first protective layer and connected to the second electrode, wherein
        the color filter substrate further comprises: a color filter layer provided between the first substrate and the first electrode; the color filter layer comprises a black matrix and color filters separated by the black matrix;
        the second electrode is provided to correspond to the color filter, and the first connection electrode is provided to correspond to the black matrix;
        in a region corresponding to the first connection electrode, the first protective layer protrudes along a direction away from the second electrode to from a protrusion;
        the first protective layer is provided with a window at a position where the second electrode is provided, and a portion of or the entirety of the second electrode is exposed out of the window; and
        the first connection electrode is provided on the protrusion, and the first connection electrode extends to the window to partially or completely covering an exposed portion of the second electrode.

10. The device according to claim 9, wherein the protrusion has a height of 1.5-2.5 micron.

11. The device according to claim 9, wherein the first connection electrode has a thickness of 0.3-1 micron.

12. The device according to claim 9, wherein the first protective layer is made of silicon nitride, silicon oxide, photosensitive resin, or combinations thereof.

13. The device according to claim 9, further comprising: an array substrate, wherein
    the array substrate comprises: a second substrate, a thin film transistor provided on the second substrate, a protective layer covering the thin film transistor, and a second connection electrode provided on the protective layer; and
    the protective layer is provided with a protective layer via-hole, and the second connection electrode is connected to a drain electrode of the thin film transistor through the protective layer via-hole.

14. The device according to claim 13, wherein the second connection electrode is in contact with and is electrically connected with the first connection electrode.

15. The device according to claim 13, wherein at a position where the second connection electrode is provided, the protective layer protrudes along a direction away from the thin film transistor to form a protrusion.

* * * * *